(12) United States Patent
Miyazaki et al.

(10) Patent No.: US 6,518,825 B2
(45) Date of Patent: Feb. 11, 2003

(54) SEMICONDUCTOR INTEGRATED CIRCUIT DEVICE

(75) Inventors: Masayuki Miyazaki, Tokyo (JP); Goichi Ono, Kokubunji (JP); Koichiro Ishibashi, Warabi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/863,349

(22) Filed: May 24, 2001

(65) Prior Publication Data

US 2001/0046156 A1 Nov. 29, 2001

(30) Foreign Application Priority Data

May 25, 2000 (JP) ........................................ 2000-159543

(51) Int. Cl.[7] ................................................ H03K 3/01
(52) U.S. Cl. ........................ 327/534; 327/535; 327/537
(58) Field of Search ................................. 327/534, 537, 327/538, 543, 535, 544

(56) References Cited

U.S. PATENT DOCUMENTS 5,874,851 A * 2/1999 Shiota ........................ 327/537
6,046,627 A * 4/2000 Itoh et al. .................... 327/546
6,252,452 B1 * 6/2001 Hatori et al. ................ 327/544

OTHER PUBLICATIONS

Hiroyuki Mizuno et al.—A 18uA—Standby0Current 1.8V 200 MHz Microprocessor with Self Substrate–Biased Data–Retention mode—1999 IEEE International Solid–State Circuits Conference–Digest of Technical papers—pp. 280.281.

* cited by examiner

Primary Examiner—Tuan T. Lam
Assistant Examiner—Hiep Nguyen
(74) Attorney, Agent, or Firm—Miles & Stockbridge P.C.

(57) ABSTRACT

In a semiconductor integrated circuit device comprising a CMOS circuit, the CMOS circuit operating at a high speed, consuming a small amount of power, is achieved. In particular, acceleration of the operating speed under low voltage is achieved. The semiconductor integrated circuit device of the invention comprises a main circuit including a CMOS circuit, a changeover circuit, a substrate bias control circuit and a switching circuit and, in accordance with a changing signal from the changeover circuit, switches states of a substrate of a MOS transistor of the main circuit between a state in which normal supply voltage as well as ground voltage are applied and a state in which forward bias is applied. The changeover circuit detects a drop in supply voltage, etc. and outputs changing signals.

10 Claims, 11 Drawing Sheets

SEMICONDUCTOR INTEGRATED CIRCUIT DEVICE

FIELD OF THE INVENTION

The present invention relates generally to a semiconductor integrated circuit device and more particularly to a semiconductor integrated circuit device operating at a high speed and consuming a small amount of electric power.

BACKGROUND OF THE INVENTION

The power consumed by a semiconductor integrated circuit device using a CMOS circuit consists of power consumed dynamically due to electric charge and discharge at the times of switching and power consumed statically due to subthreshold leak currents. Because dynamic consumption is proportional to the square of supply voltage VDD, dynamic consumption can be reduced effectively by lowering supply voltage VDD. Accordingly the supply voltage VDD of CMOS semiconductor integrated circuit devices of microprocessors, etc. is showing a tendency to lower. Some microprocessors are provided with a power-management mechanism, which enable the microprocessor to operate in two or more modes. In the standby mode of such a microprocessor, clock signals are not fed to the execution unit and, thereby, the dynamic power consumption of the non-operating execution unit is reduced significantly. On the other hand, the static consumption due to subthreshold leak currents has not been reduced.

The operating speed of a CMOS circuit lowers as the supply voltage VDD lowers. To prevent the operating speed from lowering, the threshold voltage of the MOS transistors has to be reduced as the supply voltage VDD lowers. However, when the threshold voltage is reduced, the subthreshold leak currents become significantly large. Accordingly the static consumption due to subthreshold leak currents has become salient as the supply voltage VDD has lowered. Thus hoped for is a semiconductor integrated circuit device of a microprocessor or the like which can operate at a high speed, consuming a small amount of power.

Proposed to solve the above problem is a method of controlling the threshold voltage of MOS transistors with variable substrate voltage [pp. 280–281, Digest of Technical Papers (February 1999), 1999 International Solid-State Circuits Conference]. In the active mode for the normal high-speed operation, the substrate voltage of the PMOS transistor (p-channel MOS transistor) is set to the supply voltage and that of the NMOS transistor (n-channel MOS transistor) is set to the ground voltage. In the standby mode in which high-speed operation is not required of the CMOS circuit, the substrate voltage of the PMOS transistor is raised over the supply voltage VDD and that of the NMOS transistor is lowered below the ground voltage (this operation is hereinafter referred to as "applying low substrate bias"). By applying low substrate voltage to the substrates of the MOS transistors in the standby mode, the threshold voltage of the MOS transistors constituting the CMOS circuit can be raised and, thereby, the static consumption due to subthreshold leak currents can be reduced.

To achieve a CMOS circuit capable of operating at a high speed and a low power-consumption level, the threshold voltages of the MOS transistors are lowered for high-speed operation in the active mode and raised to reduce the subthreshold leak currents in the standby mode.

On the other hand, a microprocessor is required to operate in a wide range of supply voltage. As indicated by the curve (A) in FIG. 2, the operating speed of a CMOS circuit decreases rapidly as the supply voltage lowers. Accordingly it is now difficult to run a CMOS circuit at a high speed under low voltage in the active mode just by setting the substrate voltage to the supply voltage and the ground voltage as described above. In the active mode, therefore, the substrate voltage of the PMOS transistor is lowered below the supply voltage VDD and that of the NMOS transistor is raised over the ground voltage (this operation is hereinafter referred to as "applying high substrate bias") By applying high substrate bias to the substrates of the MOS transistors, their threshold voltage can be reduced and the operating speed of the CMOS circuit can be raised.

On the other hand, applying high substrate bias to the substrates of the MOS transistors means applying forward bias to the substrates in the direction of p-n junction, which increases the leak currents and may induce a latch-up phenomenon to damage the transistors. In the range of low supply voltage, however, the increase in the leak currents is limited and the latch-up phenomenon can be prevented. Therefore, it is preferable that the substrate bias of the PMOS transistor and that of the NMOS transistor are set to the supply voltage and the ground voltage, respectively, in the range of high supply voltage and high substrate bias is applied to the substrates for high-speed operation in the range of low supply voltage. In the standby mode, low substrate bias is applied to the substrates to hold down the leak currents. Thus a CMOS circuit operating at a high speed, consuming a small amount of power, can be achieved.

This invention achieves the following effects by applying low substrate voltage to the substrates in the standby mode in the range of high supply voltage and applying high substrate voltage to the substrates in the range of low supply voltage.

(1) To widen the voltage range in which a CMOS circuit can operate (2) To reduce the leak currents of a CMOS circuit in the standby mode in the range of high supply voltage and, thereby, reduce the power consumption of the CMOS circuit (3) To increase the operating speed of a CMOS circuit in the range of low supply voltage

SUMMARY OF THE INVENTION

This invention provide a semiconductor integrated circuit device comprising a main circuit which includes a PMOS transistor having a source-drain channel between a first operating-potential point and a second operating-potential point and a NMOS transistor having a source-drain channel between the first operating-potential point and the second operating-potential point and connected in series to the PMOS transistor. When the changing signal is in a first state, the first operating potential is fed as substrate potential of the PMOS transistor and the second operating potential is fed as substrate potential of the NMOS transistor. When the changing signal is in a second state, first substrate potential lower than the first operating potential is fed as substrate potential of the PMOS transistor and second substrate potential higher than the second operating potential is fed as substrate potential of the NMOS transistor. With such substrate potential, the main circuit operates at high speed.

Preferably, the state of the changing signal is changed over by the first operating potential or the operating speed of the main circuit.

In addition, an active mode and a standby more are provided, and reverse bias is applied to the substrates of MOS transistors in standby mode to reduce the power consumption further.

Other and further objects, features and advantages of the invention will appear more fully from the following description.

BRIEF DESCRIPTION OF THE DRAWINGS

A preferred form of the present invention is illustrated in the accompanying drawings in which.

DETAILED DESCRIPTION OF THE PREFERRED EMBODIMENTS

Referring to drawings, embodiments of the present invention will be described below.

Figure 1:
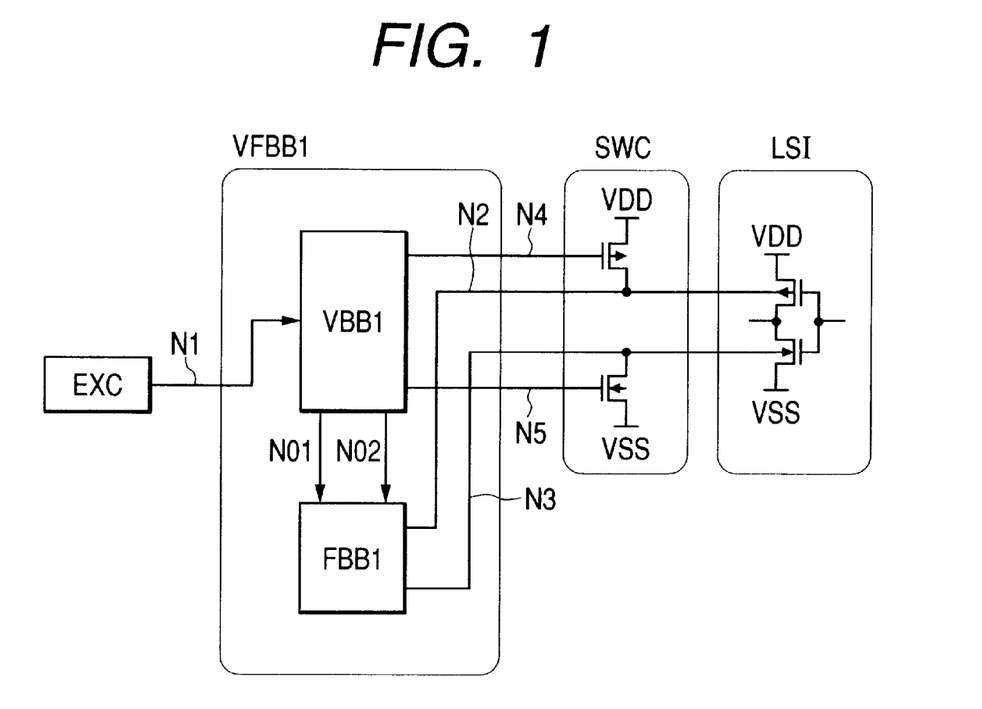
FIG. 1 is a block diagram of a first embodiment of the invention.

FIG. 1 shows an embodiment of a semiconductor integrated circuit device of the present invention. The semiconductor integrated circuit device of the present invention comprises a main circuit LSI which is a semiconductor integrated circuit, such as a microprocessor, including a changeover circuit EXC, a substrate bias control circuit VFBB1, and a switching circuit SWC. The substrate bias control circuit VFBB1 comprises a standby control circuit VBB1 and an active control circuit FBB1.

The changeover circuit EXC outputs a changing signal N1. Upon receipt of the changing signal N1, the substrate bias control circuit VFBB1 outputs a PMOS substrate bias signal N2, an NMOS substrate bias signal N3, a PMOS switch gate signal N4, and an NMOS switch gate signal N5. Besides, in the substrate bias control circuit VFBB1, the standby control circuit VBB1 outputs the PMOS switch gate signal N4, the NMOS switch gate signal N5, and control signals N01 and N02 when it receives the changing signal N1. Moreover, the active control circuit FBB1 in the substrate bias control circuit VFBB1 outputs the PMOS substrate bias signal N2 and the NMOS substrate bias signal N3 when it receives the control signals N01 and N02.

Upon receipt of the PMOS switch gate signal N4 and the NMOS switch gate signal N5, the switching circuit SWC outputs the PMOS substrate bias signal N2 and the NMOS substrate bias signal N3. Upon receipt of the PMOS substrate bias signal N2 and the NMOS substrate bias signal N3, the main circuit LSI gives the signals to the substrates of MOS transistors of the main circuit LSI respectively.

Figure 2:
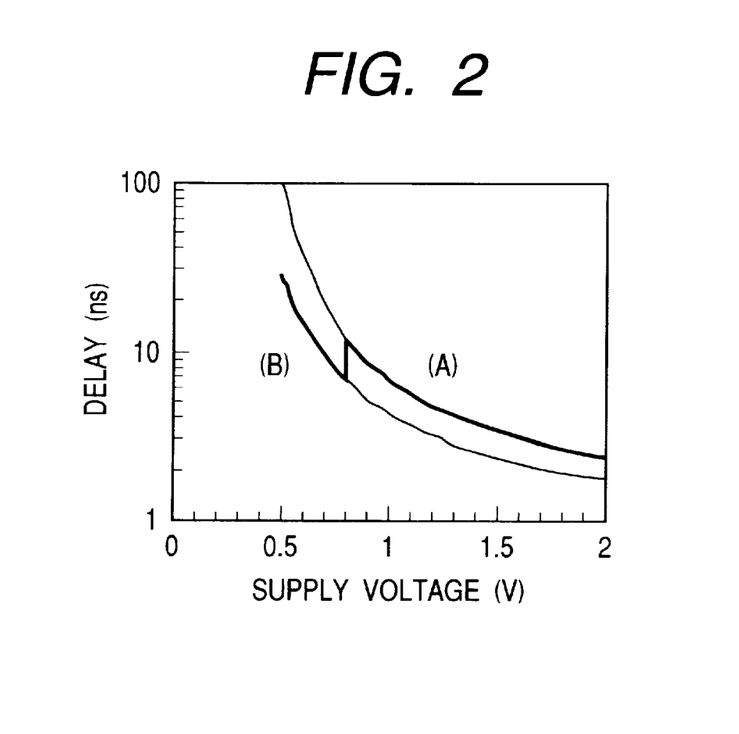
FIG. 2 shows that the delay time of a CMOS circuit has dependency on the supply voltage.

The main circuit LSI including a CMOS circuit changes its operating speed as the supply voltage changes. The delay time of a CMOS circuit has dependency on the supply voltage as is shown in FIG. 2. As represented by the curve (A), the delay time increases as the supply voltage decreases. On the other hand, when 0.5-V forward bias is applied to the substrates of the CMOS circuit, the delay time is reduced compared to the curve (A) as represented by the curve (B) and the operating speed is raised. Forward bias means to apply high substrate bias to the substrate. For example, voltage lower than the supply voltage by 0.5 V is applied to the substrate of a PMOS transistor, and voltage higher than the ground voltage by 0.5 V is applied to the substrate of a NMOS transistor. As described above, applying forward bias to a CMOS circuit causes useless leakage currents in the circuit which increase the power consumption or can cause the circuit to misoperation. It tends to induce latch-up phenomena and can damage transistors. However forward bias does not bring about such problems in the case of low-voltage driving. Therefore, the operating speed of a CMOS circuit can be raised in the low-voltage area by applying forward bias to it when it is driven by voltage of, for example, 1 V or less and by applying usual substrate bias to it (applying the supply voltage to the substrate of the PMOS transistor and the ground voltage to the substrate of the NMOS transistor) when it is driven by voltage over 1 V. If the substrate bias is switched based on, for example, the supply voltage, the changeover circuit EXC measures the supply voltage and change the substrate bias to the usual substrate bias of the curve (A) in FIG. 2 when the supply voltage is higher than 0.8 V and to the forward bias of the curve (B) when the supply voltage is lower than 0.8 V. Alternatively, the changeover circuit EXC measures directly the delay time of the CMOS circuit and controls the substrate bias automatically so as to supply the usual substrate bias of the curve (A) when the delay time is shorter than 10 ns and the forward bias of the curve (B) when the delay time is longer than 10 ns.

In addition to the above methods, the changeover circuit EXC can be configured so as to change the substrate bias of the CMOS circuit based on instructions from the operation system, instructions from application software, external input signals, signals from a memory, or the like.

For the changeover circuit EXC to issue an instruction to supply the usual substrate bias, the changeover circuit EXC asserts the changing signal N1. Then the standby control circuit VBB1 sets the PMOS switch gate signal N4 to VSUB voltage (−1.5 V) and the NMOS switch gate signal N5 to VWEL voltage (3.0 V). Upon receipt of the PMOS switch gate signal N4, the PMOS transistor of the switching circuit SWC turns on and outputs the supply voltage VDD as a PMOS substrate bias signal N2. Similarly, upon receipt of the NMOS switch gate signal N5, the NMOS transistor of the switching circuit SWC turns on and outputs the ground voltage VSS as the NMOS substrate bias signal N3. Thus the substrate bias of the main circuit LSI is set by supplying the supply voltage to the substrate of the PMOS transistor and the ground voltage to the substrate of the NMOS transistor.

Figure 3:
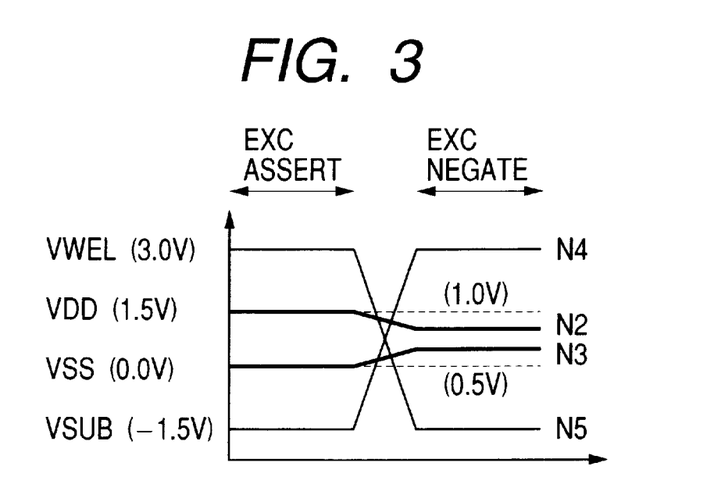
FIG. 3 shows waveforms of operations of the first embodiment of the invention.

On the other hand, for the changeover circuit EXC to issue an instruction to supply the forward bias, the changeover circuit EXC negates the changing signal N1. Then the standby control circuit VBB1 sets the PMOS switch gate signal N4 to VWEL voltage (3.0 V) and the NMOS switch gate signal NS to VSUB voltage (−1.5 V). Upon receipt of the PMOS switch gate signal N4, the PMOS transistor of the switching circuit SWC turns off and outputs 0.5-V forward bias as a PMOS substrate bias signal N2 from the active control circuit FBB1. This 0. 5-V forward bias equals to 1.0 V if the supply voltage is 1.5 V. Similarly, upon receipt of the NMOS switch gate signal N5, the NMOS transistor of the switching circuit SWC turns off and outputs 0.5-V forward bias as an NMOS substrate bias signal N3 from the active control circuit FBB1. This voltage is 0.5 V because the ground voltage is 0 V. Thus 0.5-V forward bias is applied to the substrates of the main circuit LSI by applying 1.0 V to the substrate of the PMOS transistor and 0.5 V to the substrate of the NMOS transistor. FIG. 3 shows the waveforms of the PMOS substrate bias signal N2, the NMOS substrate bias signal N3, the PMOS switch gate signal N4, and the NMOS switch gate signal N5 while the changeover circuit EXC is issuing an assert signal and while it is issuing a negate signal.

In the above description, although the supply voltage VDD, the ground voltage VSS, the VWEL voltage, and the VSUB voltage are assumed to be 1.5, 0.0, 3.0, and −1.5 V, those voltages are not limited to these values. It will do if their values are as follows: VWEL>VDD>VSS>VSUB. The same holds true of the description below.

Figure 4:
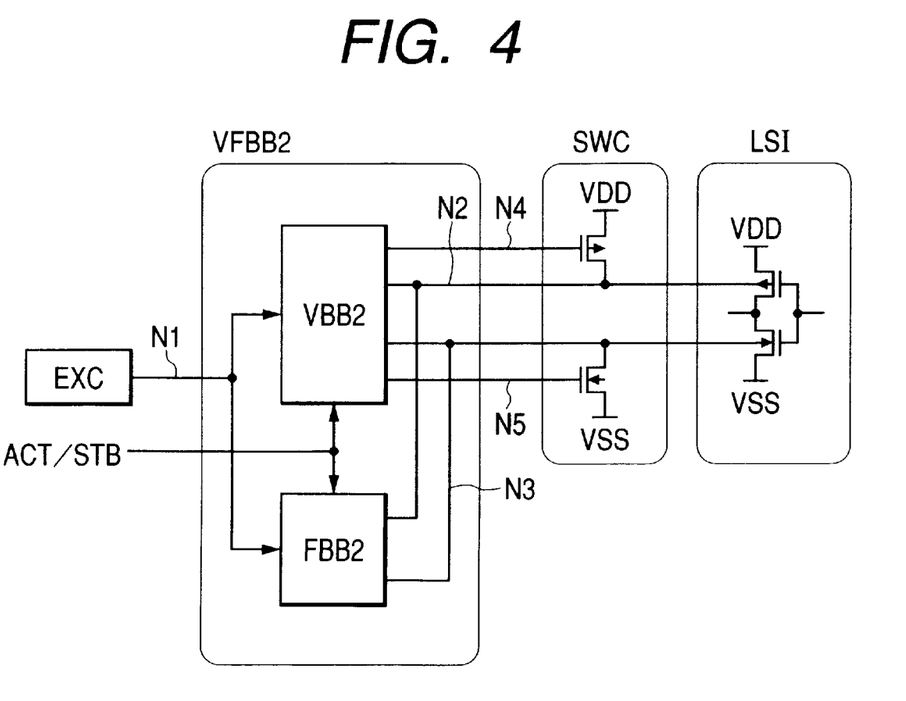
FIG. 4 is a block diagram of a second embodiment of the invention.

FIG. 4 shows another embodiment of a semiconductor integrated circuit device of the present invention.

The semiconductor integrated circuit device of the invention comprises a main circuit LSI which is a semiconductor integrated circuit, such as a microprocessor, including a changeover circuit EXC, a substrate bias control circuit VFBB2, and a switching circuit SWC. The substrate bias control circuit VFBB2 comprises a standby control circuit VBB2 and an active control circuit FBB2.

The changeover circuit EXC outputs a changing signal N1. When the changing signal N1 and a mode signal ACT/STB are inputted in the substrate bias control circuit VFBB2, it outputs a PMOS substrate bias signal N2, an NMOS substrate bias signal N3, a PMOS switch gate signal N4, and an NMOS switch gate signal N5. The standby control circuit VBB2 in the substrate bias control circuit VFBB2 outputs the PMOS switch gate signal N4, the NMOS switch gate signal N5, the PMOS substrate bias signal N2, and the NMOS substrate bias signal N3 when it receives the changing signal N1 and the mode signal ACT/STB. The active control circuit FBB2 in the substrate bias control circuit VFBB2 outputs the PMOS substrate bias signal N2 and the NMOS substrate bias signal N3 when it receives the changing signal N1 and the mode signal ACT/STB.

Upon receipt of the PMOS switch gate signal N4 and the NMOS switch gate signal N5, the switching circuit SWC outputs the PMOS substrate bias signal N2 and the NMOS substrate bias signal N3. Upon receipt of the PMOS substrate bias signal N2 and the NMOS substrate bias signal N3, the main circuit LSI gives the signals to the substrates of MOS transistors of the main circuit LSI respectively.

By applying forward bias to the substrates of the CMOS circuit, its operating speed is raised as indicated by the curve (B) in FIG. 2. On the contrary, if reverse bias, or low substrate bias, is applied to the substrates of the CMOS circuit, the operating speed and the leakage currents of the CMOS circuit are reduced, reducing the power consumption of the CMOS circuit. In addition, while the main circuit LSI is in its standby mode, the CMOS circuit does not function; therefore the power consumption of the whole circuit can be reduced by applying low substrate bias to the substrates of the CMOS circuit and, thereby, holding down the leakage currents. Accordingly, a semiconductor integrated circuit device operating at a higher speed and consuming less electric power can be made by adding a function to apply reverse bias to the substrates of the CMOS circuit during the standby mode to the function of the changeover circuit EXC to switch the substrate bias between usual substrate bias and forward bias described in the embodiment of FIG. 1. The main circuit LSI is switched between the standby mode and the active mode by the mode signal ACT/STB.

Figure 5:
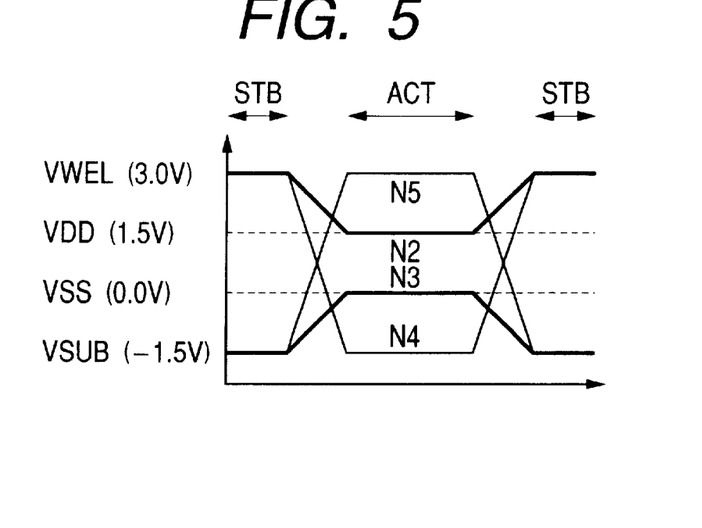
FIG. 5 shows waveforms of operations of the second embodiment of the invention.

FIG. 5 shows the waveforms of the PMOS substrate bias signal N2, the NMOS substrate bias signal N3, the PMOS switch gate signal N4, and the NMOS switch gate signal N5 in the active and standby modes while the changeover circuit EXC asserts the changing signal N1 for the usual substrate bias. While the mode signal ACT/STB is asserted, the main circuit LSI is in the active mode and the standby control circuit VBB2 sets the PMOS switch gate signal N4 to VSUB voltage (−1.5 V) and the NMOS switch gate signal N5 to VWEL voltage (3.0 V) and outputs them. Then the PMOS and NMOS transistors of the switching circuit SWC turn on and the supply voltage VDD (1.5 V) and the ground voltage VSS (0.0 V) are supplied to the PMOS substrate bias signal N2 and the NMOS substrate bias signal N3, respectively, for the main circuit LSI to operate with usual substrate bias.

When the mode signal ACT/STB is negated, the main circuit LSI shifts into the standby mode and the standby control circuit VBB2 sets the PMOS switch gate signal N4 to VWEL voltage (3.0 V) and the NMOS switch gate signal N5 to VSUB voltage (−1.5 V) and outputs them. Then the PMOS and NMOS transistors of the switching circuit SWC turn off and, in turn, the standby control circuit VBB2 supplies VWEL voltage (3.0 V) and VSUB voltage (−1.5 V) to the PMOS substrate bias signal N2 and the NMOS substrate bias signal N3, respectively, to apply back bias to the substrates of the main circuit LSI and, thereby, reduce the standby leakage currents.

Figure 6:
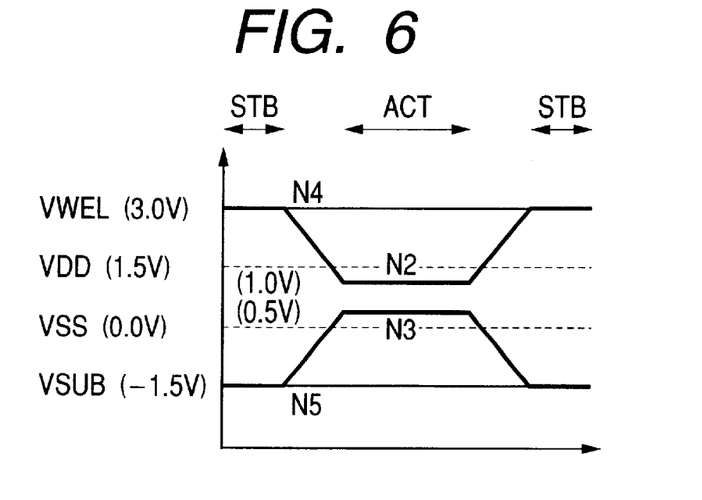
FIG. 6 shows waveforms of operations of the second embodiment of the invention.

FIG. 6 shows the waveforms of the PMOS substrate bias signal N2, the NMOS substrate bias signal N3, the PMOS switch gate signal N4, and the NMOS switch gate signal N5 in the active and standby modes while the changeover circuit EXC negates the changing signal N1 for forward bias. While the changing signal N1 is negated, the standby control circuit VBB2 fixes the PMOS switch gate signal N4 and the NMOS switch gate signal N5 to VWEL voltage (3.0 V) and VSUB voltage (−1.5 V), respectively, to turn off each transistor of the switching circuit SWC. While the mode signal ACT/STB is asserted, the main circuit LSI is active and the active control circuit FBB2 supplies 1.0 V and 0.5 V to the PMOS substrate bias signal N2 and the NMOS substrate bias signal N3, respectively, and, thereby, the main circuit LSI operates with forward bias at a high speed. When the mode signal ACT/STB is negated, the main circuit LSI shifts into the standby mode and the active control circuit FBB2 turns off. In turn, the standby control circuit VBB2 supplies VWEL voltage (3.0 V) and VSUB voltage (−1.5 V) to the PMOS substrate bias signal N2 and the NMOS substrate bias signal N3, respectively, so as to apply back bias to the substrates of the main circuit LSI and reduce the standby leakage currents.

Figure 7:
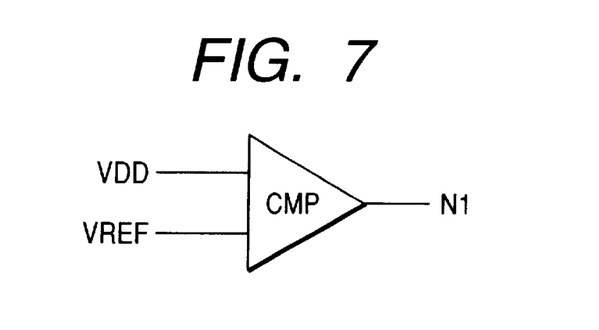
FIG. 7 is a block diagram of a changeover circuit.

FIG. 7 shows an embodiment of a changeover circuit EXC.

Figure 8:
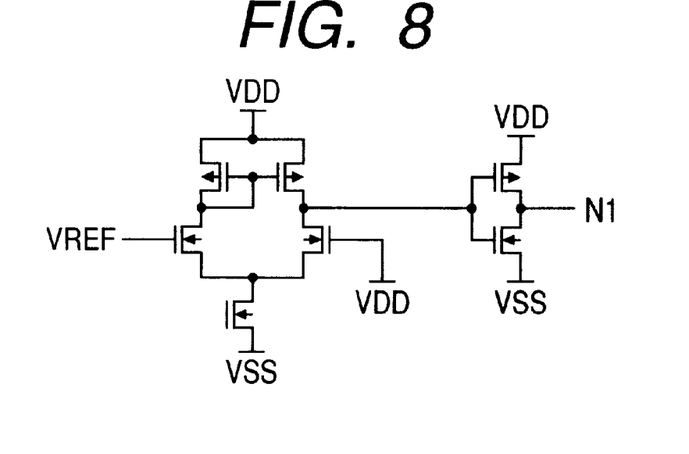
FIG. 8 is a block diagram of a comparator.

In the case that the changeover circuit EXC is to detect the change of voltage, it comprises a comparator CMP. Supply voltage VDD and reference voltage VREF are inputted in the comparator CMP, which asserts N1 output when supply voltage VDD is higher than reference voltage VREF and negates N1 output when supply voltage VDD is lower than reference voltage. For example, if reference voltage VREF is set to 0.8 V, N1 is asserted for usual substrate bias control when supply voltage VDD is 0.8 V or higher and N1 is negated for forward bias control when supply voltage VDD is lower than 0.8 V. In this way the changeover circuit EXC detects drops in the supply voltage. FIG. 8 shows an example of specific circuit configurations of the comparator CMP.

Figure 9:
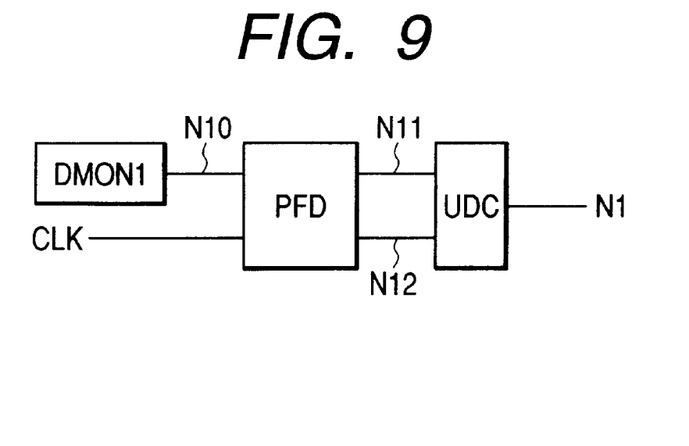
FIG. 9 is another block diagram of a changeover circuit.

FIG. 9 shows another embodiment of changeover circuit EXC. The changeover circuit EXC comprises a delay monitor DMON1, a phase-frequency comparator PFD, and an up-down counter UDC. The delay monitor DMON1 outputs a clock signal N10 of which the frequency corresponds to the supply voltage. Upon receipt of the clock signal N10 and a reference clock signal CLK, the phase-frequency comparator PFD outputs an up signal N11 or a down signal N12. Upon receipt of the up signal N11 or the down signal N12 as the case may be, the up-down counter UDC outputs a changing signal N1. The phase-frequency comparator PFD outputs an up signal N11 when the frequency of the clock signal N10 is higher than that of the reference clock signal CLK and a down signal N12 when the former is lower than the latter. The up-down counter UDC counts up upon receipt of an up signal N11 and counts down upon receipt of a down signal N12. When the countdown becomes minimum, that is to say, the frequency of the clock signal N10 becomes lower than that of the reference clock signal CLK, the up-down counter UDC negates the N1 output. With the above configuration, the changeover circuit EXC measures the operating speed of the CMOS circuit and detects drops in the operating speed.

Figure 10:
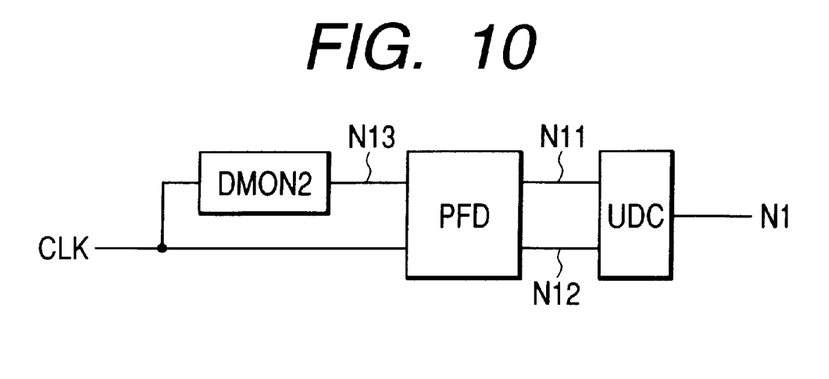
FIG. 10 is yet another diagram of a changeover circuit.

FIG. 10 shows yet another embodiment of changeover circuit EXC. The changeover circuit EXC comprises a delay monitor DMON2, a phase-frequency comparator PFD, and an up-down counter UDC. The delay monitor DMON2 has a delay time corresponding to the supply voltage and transmits a clock signal with the predetermined delay time to N13. Upon receipt of the delay signal N13 and an input clock signal CLK, the phase-frequency comparator PFD outputs an up signal N11 or a down signal N12. Upon receipt of the up signal N11 or the down signal N12 as the case may be, the up-down counter UDC outputs a changing signal N1. The phase-frequency comparator PFD outputs an up signal N11 when the delay time of the delay signal N13 is shorter than that of the input clock signal CLK and a down signal N12 when the former is longer the latter. The up-down counter UDC counts up upon receipt of an up signal N11 and counts down upon receipt of a down signal N12. When the countdown becomes minimum, that is to say, the delay time of the delay signal N13 becomes longer than that of the input clock signal CLK, the up-down counter UDC negates the N1 output. With the above configuration, the changeover circuit EXC measures the operating speed of the CMOS circuit and detects drops in the operating speed.

Figure 11:
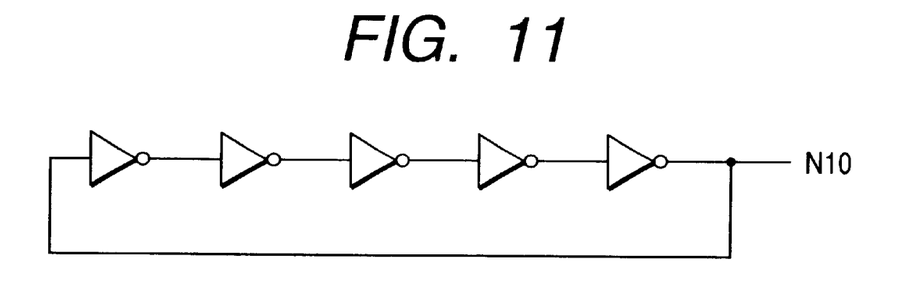
FIG. 11 is a block diagram of a delay monitor.

FIG. 11 shows an example of configurations of the delay monitor DMON1. The delay monitor DMON1 comprises a ring oscillator which is a loop of inverters. The frequency of the clock signal N10 of the ring oscillator is determined by the supply voltage fed to the inverters and the substrate bias.

Figure 12:
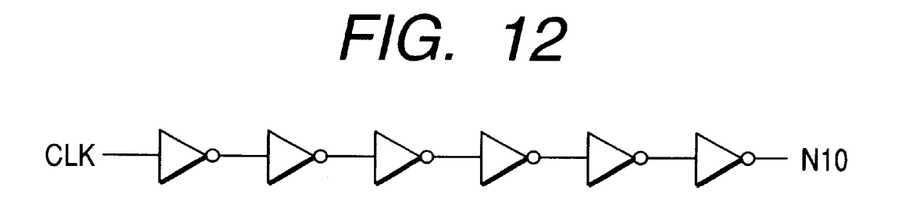
FIG. 12 is another block diagram of a delay monitor.

FIG. 12 shows an example of configurations of the delay monitor DMON2. The delay monitor DMON2 comprises a delay circuit which is a series of inverters. The delay time of the delay signal N10 of the delay monitor is determined by the supply voltage fed to the inverters and the substrate bias.

Figure 13:
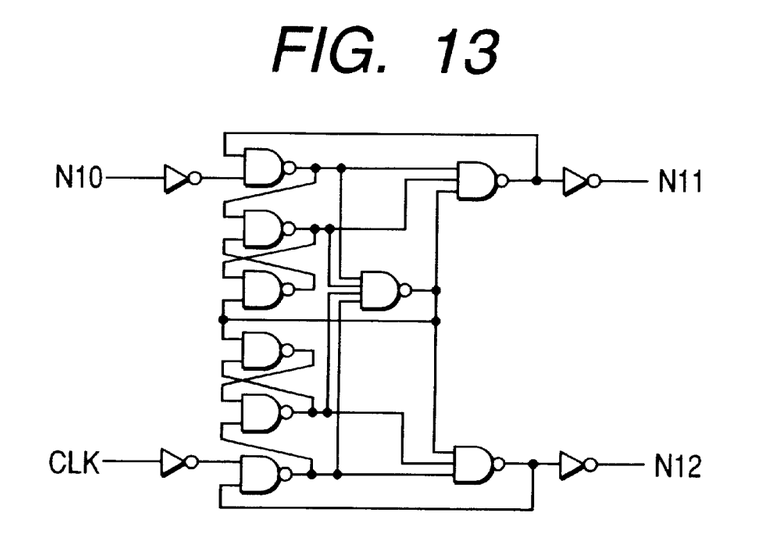
FIG. 13 is a block diagram of a phase-frequency comparator.

FIG. 13 shows an example of configurations of the phase-frequency comparator PFD. The phase-frequency comparator PFD compares the phases and the frequencies of two input signals and outputs the results of comparison through N11 and N12. The phase-frequency comparator PFD outputs an up signal N11 when the phase and the frequency of the input signal N10 are ahead of and higher than those of the clock signal CLK and a down signal N12 when the former are behind and lower than the latter.

Figure 14:
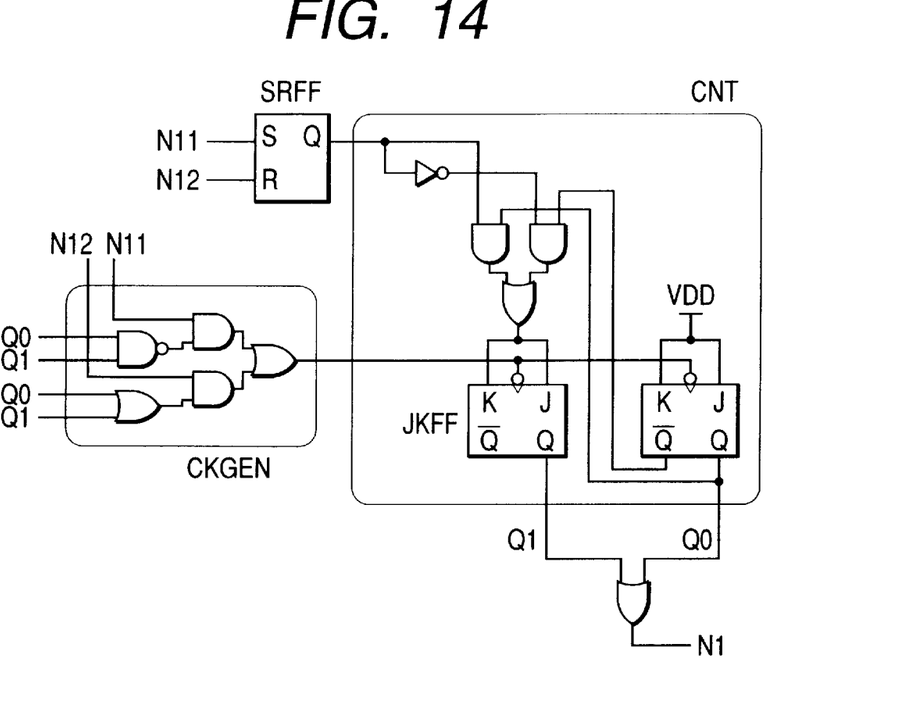
FIG. 14 is a block diagram of an up-down counter.
Figure 15:
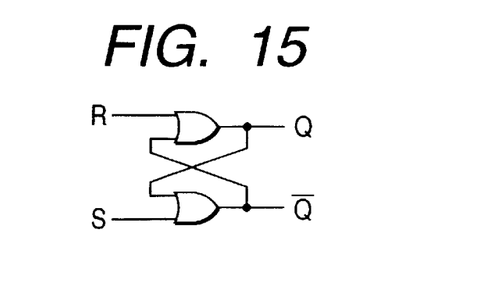
FIG. 15 is a block diagram of an SR flip-flop.
Figure 16:
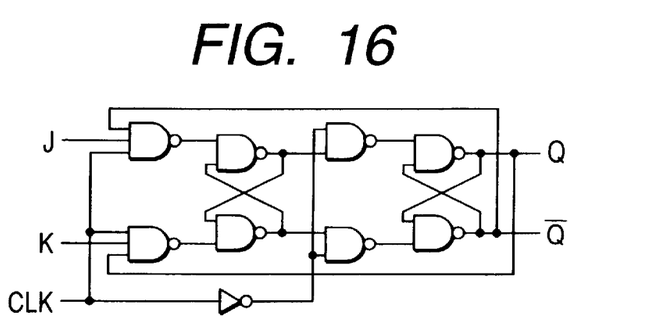
FIG. 16 is a block diagram of a JK flip-flop.

FIG. 14 shows an example of configurations of the up-down counter UDC. The up-down counter UDC comprises an SR flip-flop, a counter CNT, a clock generator CKGEN, and an OR circuit. The counter CNT comprises a JK flip-flop, an inverter circuit, an AND circuit, and an OR circuit. The clock generator CKGEN comprises an OR circuit, an AND circuit, and a NAND circuit. The SR flip-flop receives an up signal N11 or a down signal N12. Upon receipt of an up signal Nil, the SR flip-flop causes the counter CNT to count up the count outputs Q0 and Q1. Upon receipt of a down signal N12, the SR flip-flop causes the counter CNT to count down the count outputs Q0 and Q1. Upon receipt of a Q0 signal and a Q1 signal, the OR circuit outputs an N1 signal. Therefore N1 is negated only when both the Q0 and Q1 signals are "0". When both the Q0 and Q1 signals become "0", the clock generator CKGEN stops the counter CNT from counting down. When both the Q0 and Q1 signals become "1", the clock generator CKGEN stops the counter CNT from counting up. FIG. 15 shows an example of configurations of the SR flip-flop; FIG. 16, an example of configurations of the JK flip-flop.

Figure 17:
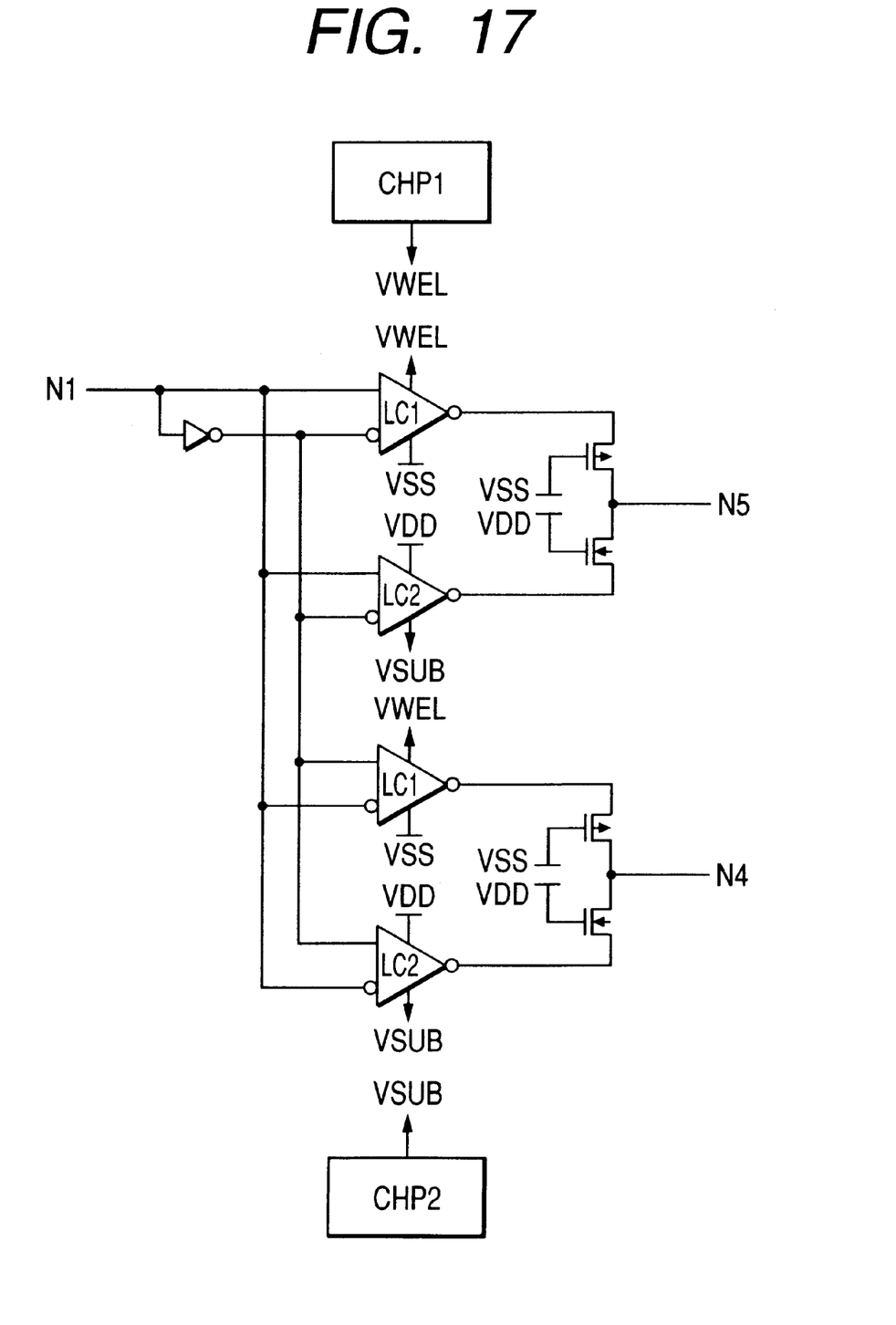
FIG. 17 is a block diagram of a standby control circuit.

FIG. 17 shows an example of configurations of the standby control circuit VBB1. The standby control circuit VBB1 comprises an inverter circuit, a level-up level converter LC1, a level-down level converter LC2, PMOS transistors, and NMOS transistors. When a changing signal N1 for switching the substrate bias between the usual substrate bias and forward bias is inputted, the NMOS switch gate signal N5 and the PMOS switch gate signal N4 become VWEL voltage (3.0 V) and VSUB voltage (−1.5 V), respectively, if N1 is asserted. Accordingly the MOS transistors of the switching circuit SWC turn on so as to apply the usual substrate bias of supply voltage and ground voltage to the substrates of MOS transistors of the main circuit. On the other hand, when N1 is negated, the NMOS switch gate signal NS becomes VSUB voltage (−1.5 V) and the PMOS switch gate signal N4 becomes VWEL voltage (3.0 V). Accordingly the MOS transistors of the switching circuit SWC turn off. At the same time, the NMOS switch gate signal N5 and the PMOS switch gate signal N4 are outputted as a control signal N01 and a control signal N02, respectively, to the active control circuit FBB1.

Figure 18:
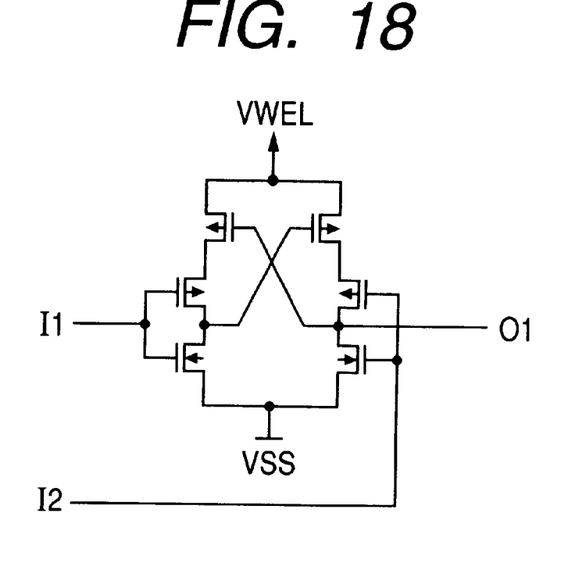
FIG. 18 is a block diagram of a level-up level converter.
Figure 19:
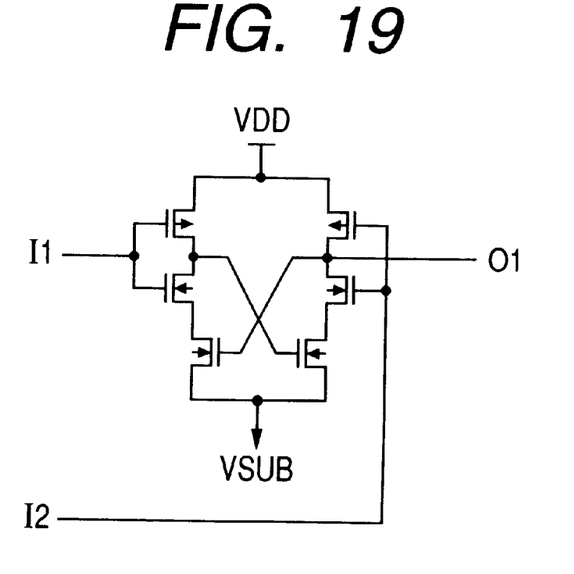
FIG. 19 is a block diagram of a level-down level converter.
Figure 20:
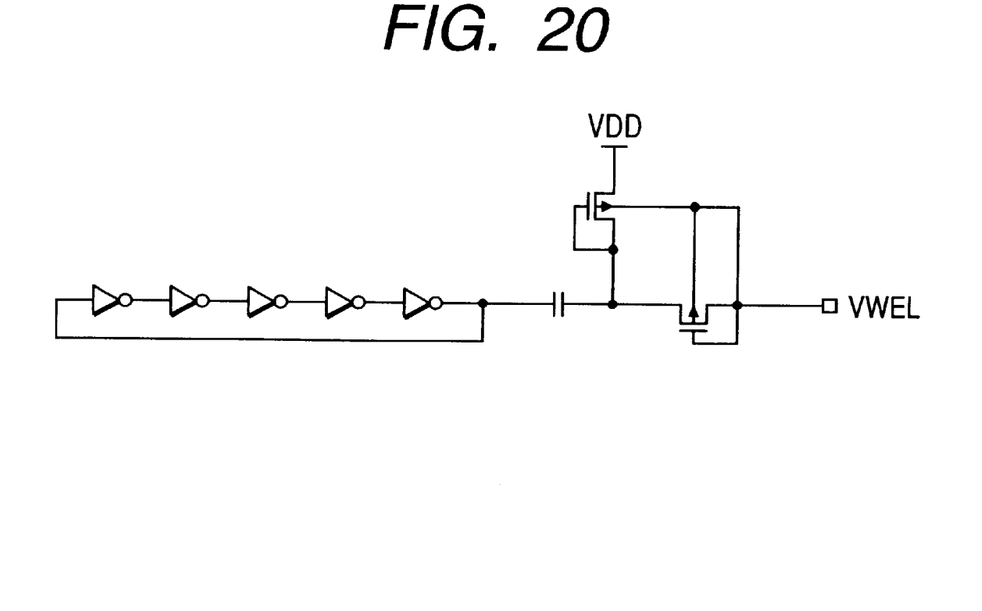
FIG. 20 is a block diagram of a charge pump for generating VWEL voltage.
Figure 21:
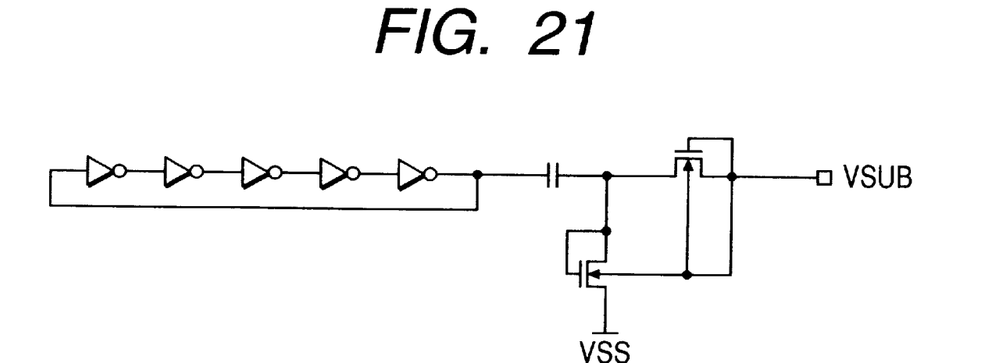
FIG. 21 is a block diagram of a charge pump for generating VSUB voltage.

A charge pump CHP1 and a charge pump CHP2 generate VWEL voltage and VSUB voltage from the supply voltage VDD and the ground voltage VSS. The level-up level converter LC1 raises the input voltage of 0.0–1.5 V to 0.0–3.0 V. The level-down level converter LC2 lowers the input voltage of 0.0–1.5 V to −1.5 to +1.5 V. FIGS. 18 and 19 show examples of configurations of the level-up and -down level converters LC1 and LC2. FIG. 20 shows an example of configurations of the charge pump CHP1 for generating VWEL voltage; FIG. 21, an example of configurations of the charge pump CHP2 for generating VSUB voltage.

Figure 22:
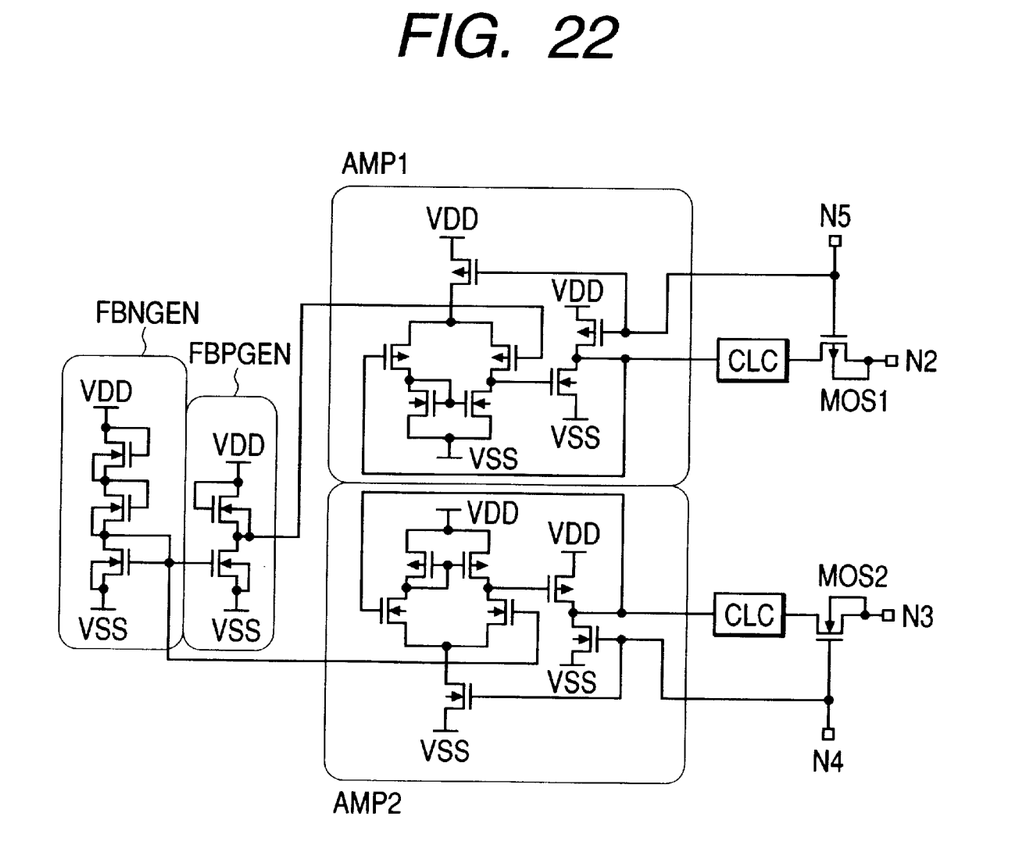
FIG. 22 is a block diagram of an active control circuit.

FIG. 22 shows an example of configurations of the active control circuit FBB1. The active control circuit FBB1 comprises a substrate bias generator FBNGEN, a substrate bias generator FBPGEN, amplifiers AMP1 and AMP2, switches MOS1 and MOS2, and current limiters CLCs. The substrate bias generator FBNGEN outputs forward bias substrate potential 0.5 V for NMOS. The substrate bias generator FBPGEN generates bias of 1.0 V when the supply voltage is 1.5 V because the same bias as the substrate potential for NMOS is used for PMOS. The outputs of the substrate bias generators FBPGEN and FBNGEN undergo current amplification by the amplifiers AMP1 and AMP2, respectively. The amplifiers AMP1 and AMP2 receive N4 and N5 signals to hold down the leakage currents while the active control circuit FBB1 is not functioning. The output currents of the amplifiers AMP1 and AMP2 are held down by the two current limiters CLCs, respectively. Each current limiter CLC may utilize the channel impedance of the MOS transistor or use an ordinary resistor. Each current limiter CLC prevents the leakage currents from growing too large during the application of forward bias. Finally, the outputs of the current limiters CLCs are outputted through the switches MOS1 and MOS2, respectively, as the PMOS substrate bias signal N2 and the NMOS substrate bias signal N3, respectively.

Figure 23:
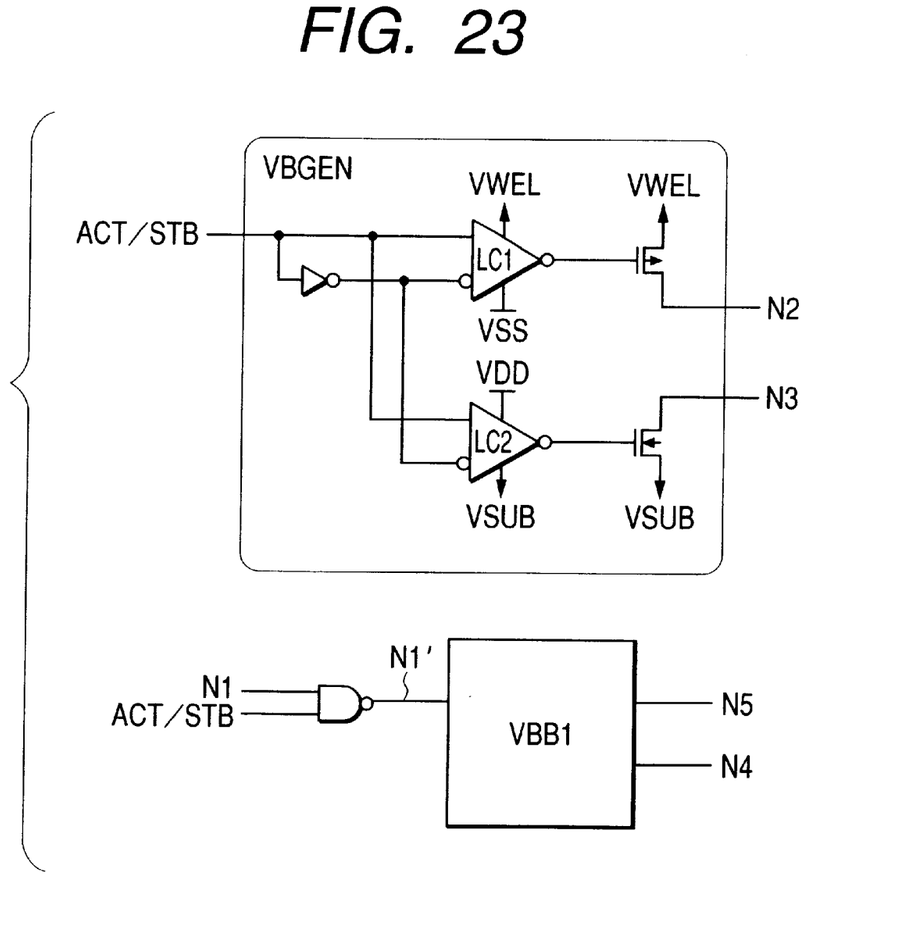
FIG. 23 is a block diagram of a standby control circuit.

FIG. 23 shows an example of configurations of the standby control circuit VBB2. The standby control circuit VBB2 comprises a substrate bias generator VBGEN and a circuit utilizing the standby control circuit VBB1. Upon receipt of a mode signal ACT/STB, the substrate bias generator VBGEN outputs a PMOS substrate bias signal N2 and a NMOS substrate bias signal N3. When the mode signal ACT/STB is asserted, the output signals ceases. When the mode signal ACT/STB is negated, or the main circuit LSI shifts into its standby mode, the output signal N2 becomes VWEL voltage and the output signal N3 becomes VSUB voltage. Upon receipt of a changing signal Ni and the mode signal ACT/STB, the standby control circuit VBB1 outputs an NMOS switch gate signal N5 and a PMOS switch gate signal N4 through an AND circuit. When both the changing signal N1 and the mode signal ACT/STB are asserted, that is to say, only when the main circuit LSI is under the usual substrate bias and in its active mode, the NMOS switch gate signal N5 and the PMOS switch gate signal N4 become VWEL voltage and VSUB voltage, respectively; otherwise N5 and N4 become VSUB voltage and VWEL voltage, respectively.

Figure 24:
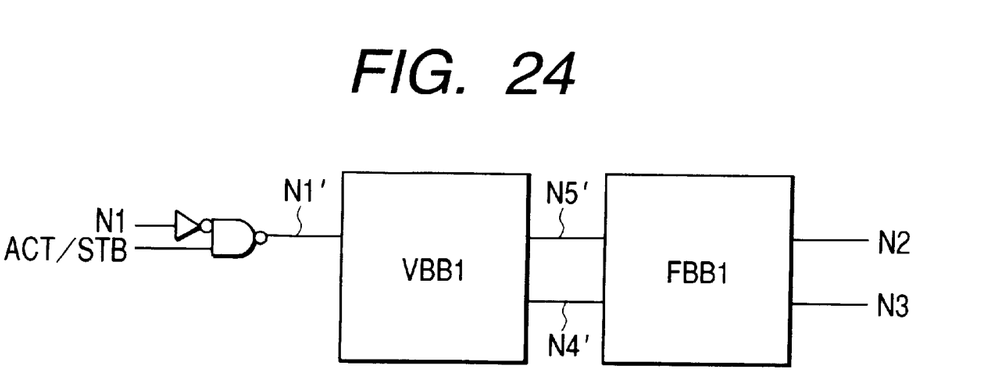
FIG. 24 is another block diagram of an active control circuit.

FIG. 24 shows another example of configurations of the active control circuit FBB2. The active control circuit FBB2 receives the changing signal N1 and the mode signal ACT/STB, and the standby control circuit VBB1 receives a signal which is made by inverting the N1 signal through an inverter and a signal which is made when a NAND of the ACT/STB signal is taken. When the active control circuit FBB1 receives what is outputted accordingly, the active control circuit FBB2 can output the PMOS substrate bias signal N2 and the NMOS substrate bias signal N3. The active control circuit FBB2 applies forward bias of 1.0 V and 0.5 V to N2 and N3, respectively, when the signal N1 is negated and the signal ACT/STB is asserted, namely, only when the main circuit LSI is under the forward bias and in its active mode. In other modes, no outputting is made.

The substrate bias control has been described on the ground that there is one control system for the main circuit LSI. However, the main circuit LSI may be divided into at least two or more sections and above-described substrate bias control may be carried out in each section independently.

In the above embodiments, since voltage higher than the supply voltage VDD is applied to the standby control circuits VBB1 and VBB2, and the MOS transistor of the switching circuit SWC, a transistor having withstand voltage of the VWEL voltage maybe used. A transistor having withstand voltage of the supply voltage VDD may be used as a MOS transistor for other circuits.

The foregoing invention has been described in terms of preferred embodiments. However, those skilled, in the art will recognize that many variations of such embodiments exist. Such variations are intended to be within the scope of the present invention and the appended claims.

What is claimed is:

1. A semiconductor integrated circuit device comprising:
   a main circuit which includes a PMOS transistor having a source-drain channel between a first operating-potential point and a second operating-potential point lower than the first operating-potential point and a NMOS transistor having a source-drain channel between said first operating-potential point and said second operating-potential point and connected in series to said PMOS transistor;
   a changeover circuit which generates a changing signal;
   a substrate bias control circuit which includes a substrate potential generator to generate a first substrate potential lower than the first operating potential and a second substrate potential higher than the second operating potential; and
   a switching circuit which includes a first switching element provided between said first operating-potential point and a substrate-potential supplying point of said PMOS transistor and a second switching element provided between said second operating-potential point and a substrate-potential supplying point of the NMOS transistor;
   wherein said substrate bias control circuit responds to the changing signal to control the switching circuit; and
      (i) in the case that said changing signal is in a first state, said first and second switching elements are turned on, the substrate of said PMOS transistor is supplied with first operating potential from said first operating-potential point and the substrate of said NMOS transistor is supplied with second operating potential from said second operating-potential point, and
      (ii) in the case that the changing signal is in a second state, said first and second switching elements are turned off, said substrate potential generator supplies said first substrate potential which is forward bias to the substrate of said PMOS transistor and said second substrate potential which is forward bias to the substrate of said NMOS transistor.

2. A semiconductor integrated circuit device as claimed in claim 1, wherein said first operating potential is power-supply potential and said second operating potential is ground potential.

3. A semiconductor integrated circuit device as claimed in claim 1, wherein the state of said changing signal outputted by said changeover circuit is determined according to an instruction from an operating system, an instruction from application software, an external input signal, an input signal from a memory, said first operating potential supplied to said semiconductor integrated circuit device, or the operating speed of said main circuit.

4. A semiconductor integrated circuit device as claimed in claim 1, wherein said first state is the case that operating potential of the PMOS and NMOS transistors of the main circuit is high level, and said second state is the case that operating potential of the PMOS and NMOS transistors of the main circuit is low level.

5. A semiconductor integrated circuit device as claimed in claim 1, wherein said first switching element is a P-type switching MOS transistor and said second switching element is an N-type switching MOS transistor, and wherein (i) in the case that said changing signal is in said first state, said substrate bias control circuit supplies a first switching-gate signal to the gate of said first switching element and a second switching-gate signal to the gate of said second switching element so that said first and second switching elements are turned on, and (ii) in the case that said changing signal is in said second state, said substrate bias control circuit supplies a third switching-gate signal to the gate of said first switching element and a fourth switching-gate signal to the gate of said second switching element so that said first and second switching elements are turned off.

6. A semiconductor integrated circuit device comprising:

a main circuit which includes a PMOS transistor having a source-drain channel between a first operating-potential point and a second operating-potential point lower than said first operating-potential point and a NMOS transistor having a source-drain channel between said first operating-potential point and said second operating-potential point and connected in series to said PMOS transistor;

a changeover circuit which generates a changing signal;

a substrate bias control circuit which receives said changing signal and a mode-changing signal and includes a first substrate potential generator to generate a first voltage lower than the first operating potential and a second voltage higher than the second operating potential and a second substrate potential generator to generate a third voltage higher than said first operating potential and a fourth voltage lower than said second operating potential; and a switching circuit which includes a first switching element provided between said first operating-potential point and a substrate-potential supplying point of said PMOS transistor and a second switching element provided between said second operating-potential point and a substrate-potential supplying point of the NMOS transistor;

wherein said substrate bias control circuit responds to said mode-changing signal and said changing signal to control the switching circuit; and (i) in the case that said mode-changing signal is in a first mode and said changing signal is in a first state, said first and second switching elements are turned on, the substrate of said PMOS transistor is supplied with first operating potential from said first operating-potential point and the substrate of said NMOS transistor is supplied with second operating potential from said second operating-potential point, (ii) in the case that said mode-changing signal is in said first mode and said changing signal is in a second state, said first and second switching elements are turned off, said first substrate potential generator supplies said first voltage to the substrate of said PMOS transistor and said second voltage to the substrate of said NMOS transistor in order to apply forward bias to substrates of said PMOS and NMOS transistors, and (iii) in the case that said mode-changing signal is in a second mode, said first and second switching elements are turned off, said second substrate potential generator supplies said third voltage to the substrate of said PMOS transistor and said fourth voltage to the substrate of said NMOS transistor in order to apply back bias to the substrates of said PMOS and NMOS transistors.

7. A semiconductor integrated circuit device as claimed in claim 6, wherein said first operating potential is power-supply potential and said second operating potential is ground potential.

8. A semiconductor integrated circuit device as claimed in claim 6, wherein the state of said changing signal outputted by said changeover circuit is determined according to an instruction from an operating system, an instruction from application software, an external input signal, an input signal from a memory, said first operating potential supplied to said semiconductor integrated circuit device, or the operating speed of said main circuit.

9. A semiconductor integrated circuit device as claimed in claim 6, wherein said first state is the case that operating potential of the PMOS and NMOS transistors of the main circuit is high level, and said second state is the case that operating potential of the PMOS and NMOS transistors of the main circuit is low level.

10. A semiconductor integrated circuit device as claimed in claim 6, wherein said first switching element is a P-type switching MOS transistor and said second switching element is an N-type switching MOS transistor, and wherein (i) in the case that said mode-changing signal is in said first mode and said changing signal is in said first state, said substrate bias control circuit supplies a first switching-gate signal to the gate of said first switching element and a second switching-gate signal to the gate of said second switching element so that said first and second switching elements are turned on, and (ii) in the case that said mode-changing signal is in said first mode and said changing signal is in said second state and the case that said mode-changing signal is in the second state, said substrate bias control circuit supplies a third switching-gate signal to the gate of said first switching element and a fourth switching-gate signal to the gate of said second switching element so that said first and second switching elements are turned off.

* * * * *